US008508826B2

(12) United States Patent
Terada et al.

(10) Patent No.: US 8,508,826 B2
(45) Date of Patent: Aug. 13, 2013

(54) MEANDERING OSCILLATOR, OPTICAL REFLECTING ELEMENT USING MEANDERING OSCILLATOR, AND IMAGE PROJECTION DEVICE USING MEANDERING OSCILLATOR

(75) Inventors: Jirou Terada, Osaka (JP); Shinsuke Nakazono, Osaka (JP); Shigeo Furukawa, Osaka (JP); Kiyomi Furukawa, legal representative, Osaka (JP); Kazuki Komaki, Osaka (JP)

(73) Assignee: Panasonic Corporation, Osaka (JP)

( * ) Notice: Subject to any disclaimer, the term of this patent is extended or adjusted under 35 U.S.C. 154(b) by 361 days.

(21) Appl. No.: 12/937,299

(22) PCT Filed: Apr. 23, 2009

(86) PCT No.: PCT/JP2009/001852
§ 371 (c)(1),
(2), (4) Date: Oct. 11, 2010

(87) PCT Pub. No.: WO2009/130902
PCT Pub. Date: Oct. 29, 2009

(65) Prior Publication Data
US 2011/0032590 A1 Feb. 10, 2011

(30) Foreign Application Priority Data
Apr. 25, 2008 (JP) .................................. 2008-115054

(51) Int. Cl.
*G02B 26/08* (2006.01)
(52) U.S. Cl.
USPC ....................... 359/221.1; 359/224.1; 359/904
(58) Field of Classification Search
USPC .......... 359/198.1–199.4, 200.6–200.8, 202.1, 359/221.2, 223.1–225.1, 226.2, 904, 290–295, 838, 846, 871, 872; 250/204, 559.06, 559.29, 250/230, 234; 347/255–260; 353/39, 98–99; 385/15–18, 22; 398/12, 19, 45
See application file for complete search history.

(56) References Cited

U.S. PATENT DOCUMENTS

| 6,936,950 | B2 * | 8/2005 | Akagawa et al. ............. 310/309 |
| 7,355,774 | B2 * | 4/2008 | Kato et al. ................. 359/224.1 |
| 7,508,111 | B2 | 3/2009 | Ko et al. |
| 7,770,450 | B2 | 8/2010 | Fujimoto et al. |
| 2006/0082250 | A1 | 4/2006 | Ko et al. |
| 2007/0146858 | A1 * | 6/2007 | Matsuda ....................... 359/224 |
| 2009/0133497 | A1 | 5/2009 | Fujimoto et al. |

FOREIGN PATENT DOCUMENTS

| JP | 2006-116696 A | 5/2006 |
| JP | 2008-035600 A | 2/2008 |
| WO | WO 2008/010337 A1 | 1/2008 |

OTHER PUBLICATIONS

International Search Report for International Application No. PCT/JP2009/001852, Jul. 14, 2009, Panasonic Corporation.
Japanese Office Action for Application No. 2008-115054, dated Nov. 20, 2012.

* cited by examiner

*Primary Examiner* — Jennifer L. Doak
(74) *Attorney, Agent, or Firm* — RatnerPrestia

(57) ABSTRACT

A meandering oscillator includes a plurality of oscillating plates bent and coupled in predetermined directions and piezoelectric actuators each including a lower electrode, a piezoelectric body, and an upper electrode stacked on the oscillating plate in this order, and wherein the piezoelectric actuators are alternately arranged on the oscillating plates. Thus, even when an element is made smaller, electrodes can be easily arranged. As a result, the productivity can be improved.

13 Claims, 10 Drawing Sheets

MEANDERING OSCILLATOR, OPTICAL REFLECTING ELEMENT USING MEANDERING OSCILLATOR, AND IMAGE PROJECTION DEVICE USING MEANDERING OSCILLATOR

This application is a U.S. National Phase Application of PCT International Application PCT/JP2009/001852.

TECHNICAL FIELD

The present invention relates to a meandering oscillator used for various actuators, an optical reflecting element using the meandering oscillator, and an image projection device using the meandering oscillator.

BACKGROUND ART

FIG. 9 illustrates an example of a conventional meandering oscillator. This meandering oscillator includes a plurality of oscillating plates 1A to 1F folded and coupled with each other and piezoelectric actuators 2 respectively arranged on oscillating plates 1A to 1F. Piezoelectric actuator 2 includes a lower electrode, a piezoelectric body, and an upper electrode. This upper electrode is formed electrically independent from an upper electrode of adjacent piezoelectric actuator 2. When voltages of opposite phases are respectively applied to these upper electrodes, adjacent oscillating plates 1A to 1F are caused to perform flexural oscillation in directions 180 degrees apart. The above-described flexural oscillation in the opposite directions can accumulate displacement about a rotational axis of this meandering oscillator, and a large driving force can be obtained.

As the conventional meandering oscillator is made smaller, there is a problem in that the productivity is reduced.

This is because piezoelectric actuators 2 are respectively arranged on oscillating plates 1A to 1F. Therefore, when adjacent oscillating plates 1A to 1F are driven in the opposite phase, each of oscillating plates 1A to 1F needs to have wires for at least the upper electrode and the adjacent piezoelectric actuators. Accordingly, it is difficult to form the wires on very small oscillating plates 1A to 1F. Moreover, this problem becomes more prominent as the element becomes smaller.

PRIOR ART DOCUMENT

Patent Document

[Patent Document 1] Unexamined Japanese Patent Publication No. 2008-035600

DISCLOSURE OF THE INVENTION

According to the present invention, the piezoelectric actuators are alternately arranged on the plurality of oscillating plates. Thus, the number of upper electrodes can be reduced, and even when an element is made smaller, electrodes can be easily arranged. As a result, the productivity can be improved.

PREFERRED EMBODIMENTS FOR CARRYING OUT OF THE INVENTION

Embodiment 1

An optical reflecting element using a meandering oscillator will be hereinafter described in Embodiment 1 of the present invention.

Figure 1:
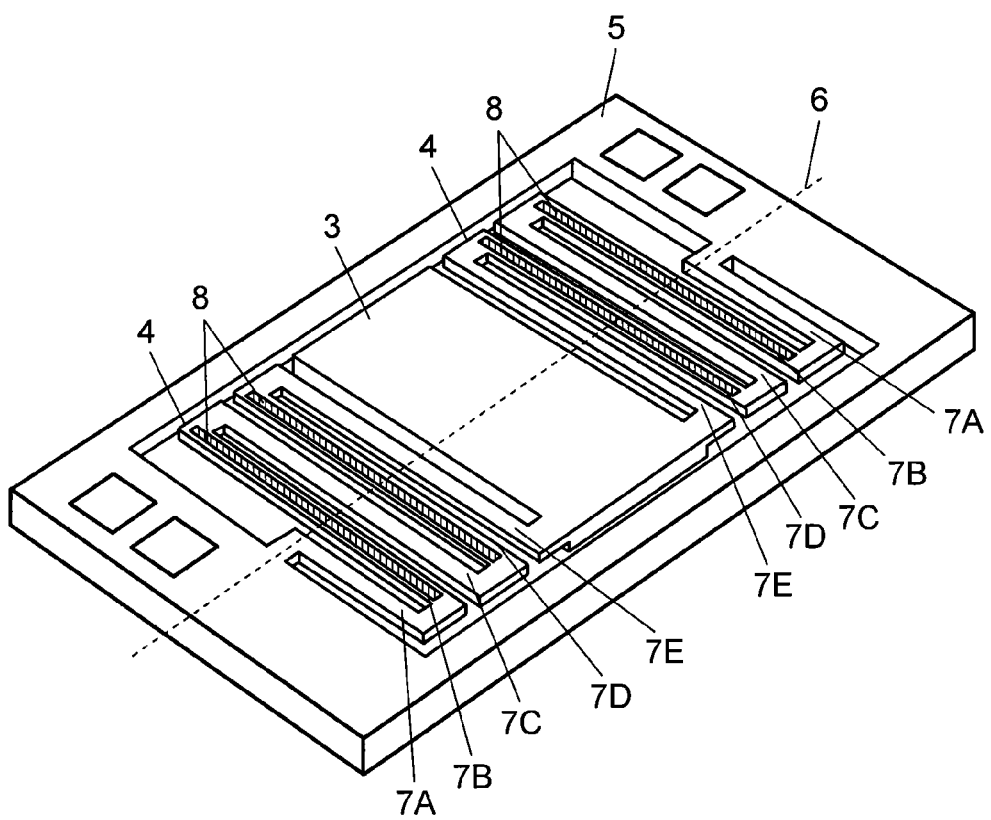
FIG. 1 is a perspective view illustrating an optical reflecting element according to Embodiment 1 of the present invention.

As shown in FIG. 1, this optical reflecting element includes mirror portion 3, pair of meandering oscillators 4, and supporting member 5. Pair of meandering oscillators 4 face each other with mirror portion 3 interposed therebetween, and ends of meandering oscillators 4 are coupled with mirror portion 3. Supporting member 5 is coupled with the other ends of meandering oscillators 4, so as to encircle the external periphery of mirror portion 3 and meandering oscillators 4. Each of these meandering oscillators 4 includes a plurality of oscillating plates 7A to 7E coupled and folded 180 degrees in predetermined directions about rotational axis 6. These piezoelectric actuators 8 are alternately arranged on oscillating plates 7A to 7E. In FIG. 1, wires of piezoelectric actuators 8 are omitted. These wires are described with reference to FIG. 2A.

Figure 2A:
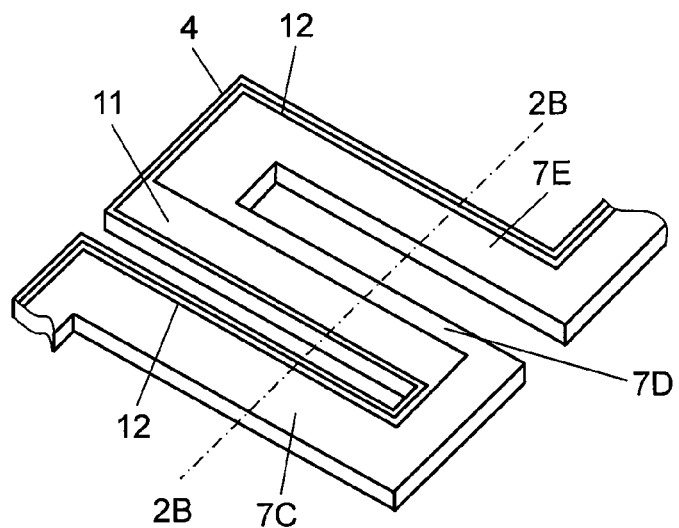
FIG. 2A is an enlarged perspective view illustrating an essential portion of the optical reflecting element according to Embodiment 1 of the present invention.
Figure 2B:
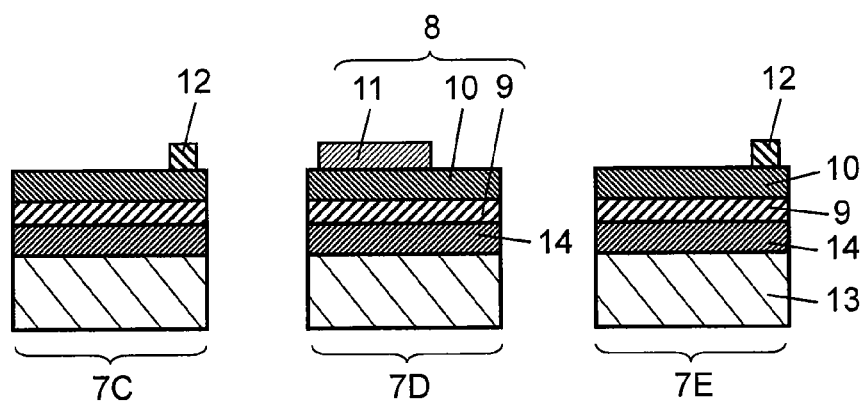
FIG. 2B is a cross sectional view taken along line 2B-2B of FIG. 2A.

In the present embodiment, piezoelectric actuator 8 includes lower electrode 9, piezoelectric body 10, and upper electrode 11, which are stacked in this order as shown in FIG. 2B.

In the present embodiment, as shown in FIGS. 2A and 2B, one meandering oscillator 4 has one continuous upper electrode 11 and wire 12 thereof, which are commonly arranged on the plurality of oscillating plates 7C to 7E (including 7A, 7B of FIG. 1).

In other words, in FIG. 2B, oscillating plate 7D is formed with wide upper electrode 11. Oscillating plates 7C, 7E adjacent to oscillating plate 7D are formed with wire 12 having a width narrower than the width of the upper electrode 11.

In the present embodiment, as shown in FIG. 1, piezoelectric actuators 8 are not formed on oscillating plates 7A, 7C, 7E having wire 12. Oscillating plates 7A, 7C, 7E and oscillating plates 7B, 7D having piezoelectric actuators 8 are arranged alternately.

Subsequently, formation of members of an optical reflecting element according to the present embodiment will be hereinafter described.

A base material of this optical reflecting element (numeral 13 of FIG. 2B) is preferably a material having a high Young's modulus, elasticity, and mechanical strength, such as metal, glass, or ceramic substrate, in terms of productivity. For example, metal, crystal, glass, quartz, or a ceramic material is preferably used, in terms of mechanical characteristics and availability. When metal such as silicon, titanium, stainless, elinvar, and brass alloy is used, an optical reflecting element having superior vibration and machining properties can be achieved.

The piezoelectric member of piezoelectric body 10 is preferably made of a material of piezoelectric body 10 having a high piezoelectric constant such as lead zirconate titanate (PZT).

In this case, when platinum is used as lower electrode 9, the crystallinity of piezoelectric body 10 can be improved. Examples of upper electrode 11 include titanium and gold.

A method for manufacturing the optical reflecting element according to the present embodiment will be described. First, as base material 13 as shown in FIG. 2B, insulating film 14 such as silicon dioxide is formed on a silicon substrate having a thickness of about 0.5 mm. Then, lower electrode 9 is stacked on this insulating film 14 by means of thin film process such as a sputtering method and an evaporation method. At this occasion, the thickness of the silicon substrate may be changed. The natural frequency can be adjusted by changing the thickness.

Thereafter, a layer of piezoelectric body 10 is formed on this lower electrode 9 by a sputtering method and the like. At this occasion, oxide dielectric material containing Pb and Ti is preferably used as an alignment control layer between piezoelectric body 10 and lower electrode 9. More preferably, an alignment control layer made of lanthanum-magnesium-added lead titanate (PLMT) is formed. Accordingly, crystal orientation property of piezoelectric body 10 is improved, and piezoelectric actuator 8 having superior piezoelectric property can be formed.

Subsequently, upper electrode 11 or titanium/gold film serving as wire 12 thereof is formed on piezoelectric body 10. At this occasion, the titanium film under the gold film is formed to enhance adhesiveness with piezoelectric body 10 such as PZT thin film. Not only titanium but also metal such as chrome can be used. As a result, a diffusion layer is formed to have superior adhesiveness with piezoelectric body 10 and be strongly bonded with the metal electrode. Accordingly, piezoelectric actuator 8 having a high degree of contact strength can be formed.

In the present embodiment, the thickness of platinum lower electrode 9 is 0.2 µm. The thickness of piezoelectric body 10 is 3.5 µm. Upper electrode 11 is formed such that the thickness of the titanium portion is 0.01 µm, and the thickness of the metal electrode portion is 0.3 µm.

Subsequently, lower electrode 9, piezoelectric body 10, upper electrode 11, and wire 12 thereof are etched and patterned by photolithographic technique.

An etching liquid for upper electrode 11 and wire 12 thereof includes iodine-potassium iodide mixed solution and ammonium hydroxide-hydrogen peroxide mixed solution, and a predetermined electrode pattern is formed with the etching liquid.

Etching methods used for lower electrode 9 and piezoelectric body 10 include a method of either dry etching method or wet etching method and a method including a combination of the above methods.

For example, in the case of dry etching method, fluorocarbon etching gas or $SF_6$ gas can be used.

Alternatively, there is a method to perform wet etching and patterning on the layer of piezoelectric body 10 using a mixed solution including hydrofluoric acid, nitric acid, acetic acid, and hydrogen peroxide, and thereafter etching and patterning lower electrode 9 by dry etching.

Subsequently, $XeF_2$ gas is used to remove unnecessary silicon portion by performing isotropic dry etching on the silicon substrate, and base material 13 is patterned. Accordingly, an optical reflecting element having a shape as shown in FIG. 1 can be formed.

When a silicon substrate is etched with a high precision, dry etching making use of anisotropism of the silicon is preferable. In this case, etching can be performed in a more linear manner by using a mixed gas including $SF_6$ for enhancing etching and $C_4F_8$ gas for suppressing etching or by alternately switching these gases.

According to the above-described manufacturing method, a small and highly-precise optical reflecting element can be efficiently made at a time.

According to the present embodiment, mirror portion 3, meandering oscillator 4, and base material 13 of supporting member 5 are integrally made from same base material 13. Therefore, the optical reflecting element having stable vibration properties and superior productivity can be achieved.

It should be noted that mirror portion 3 can be formed by performing mirror-surface grinding on the surface of base material 13. Alternatively, a metallic thin film such as gold and aluminum having superior optical reflecting property may be formed as a mirror film. In the present embodiment, gold is used as upper electrode 11, and accordingly this gold film can be used as a mirror film as it is. Thus, the production efficiency can be improved.

Operation of the optical reflecting element according to the present embodiment will be hereinafter described. First, lower electrode 9 of meandering oscillator 4 as shown in FIG. 2B is earthed, and alternating current voltage having a frequency corresponding to a resonant frequency of this optical reflecting element is inputted to upper electrode 11.

Then, at a certain point of time, the voltage is applied to piezoelectric body 10 sandwiched between lower electrode 9 and upper electrode 11. Accordingly, oscillating plate 7D having wide upper electrode 11 arranged thereon as shown in FIG. 2A is displaced and bent, so that oscillating plate 7D protrudes downward or protrudes upward.

At this occasion, since adjacent oscillating plates 7C, 7E have narrow wire 12, hardly any voltage is applied to piezoelectric body 10 of adjacent oscillating plates 7C, 7E. Therefore, oscillating plates 7C, 7E are driven in an opposite manner to adjacent oscillating plate 7D due to the principle of resonance. In other words, oscillating plates 7C, 7E are displaced and driven in a direction 180 degrees different from adjacent oscillating plate 7D.

Further, a voltage is applied to oscillating plate having wide upper electrode 11 adjacent thereto (7B of FIG. 1), and accordingly, oscillating plate 7B is displaced in a direction 180 degrees different from adjacent oscillating plate 7C described above.

Figure 3:
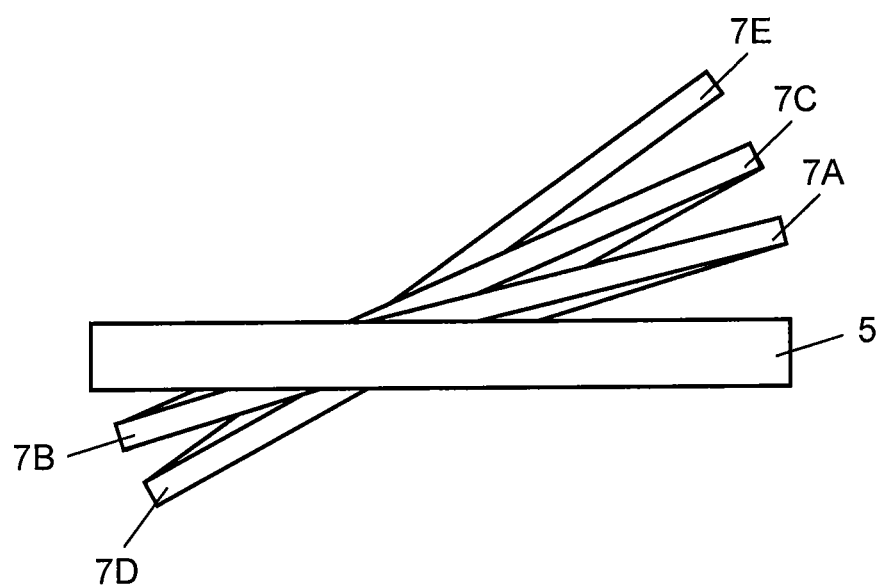
FIG. 3 is a schematic diagram illustrating operational states of the optical reflecting element according to Embodiment 1 of the present invention.

As described above, in the present embodiment, even though there is only one upper electrode 11, adjacent oscillating plates 7A to 7E are displaced in directions 180 degrees different from each other. Therefore, as shown in FIG. 3, as meandering oscillator 4 has more number of oscillating plates 7A to 7E, meandering oscillator 4 accumulates displacement about the rotational axis (numeral 6 of FIG. 1), which allows meandering oscillator 4 to displace greatly even though there is only one upper electrode 11.

In addition, in the present embodiment, the alternating current voltage is applied for resonation, which alternates the direction of bending in every unit time and increases the amount of displacement.

Further, in the present embodiment, as shown in FIG. 1, mirror portion 3 is coupled to the ends of meandering oscillators 4. In this structure, the vibrating energy of meandering oscillators 4 is transmitted to mirror portion 3, so that mirror portion 3 can be rotated about rotational axis 6.

In the present embodiment, mirror portion 3 rotates about one rotational axis 6. Accordingly, when light is emitted to mirror portion 3, scanning operation can be performed by the light in one direction, and this can be used for a laser printer, for example.

The effects of the present embodiment will be hereinafter described.

In the present embodiment, the productivity of a small optical reflecting element can be improved.

Figure 9:
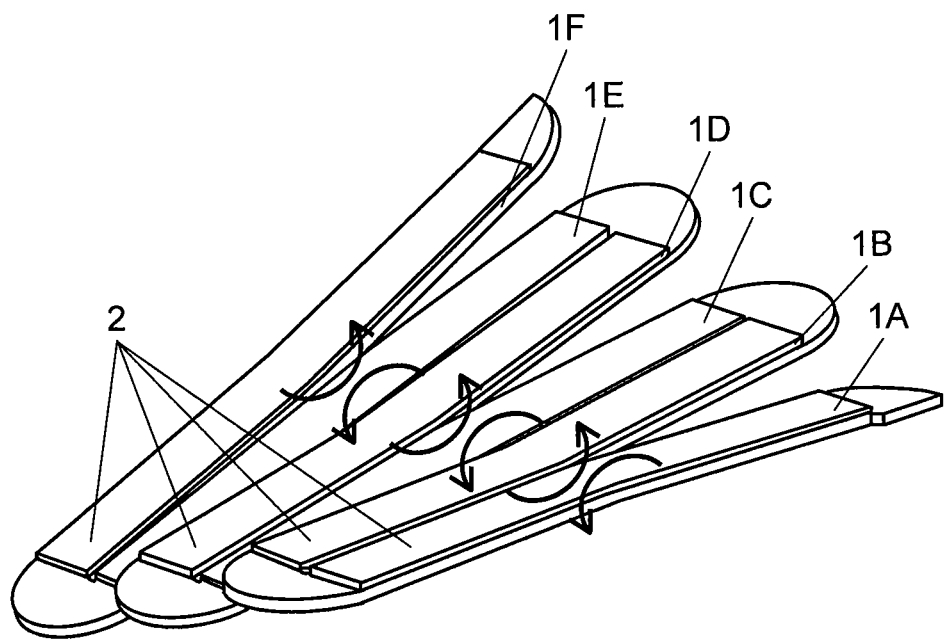
FIG. 9 is a perspective view illustrating a conventional optical reflecting element.

In other words, as shown in FIG. 9, the conventional meandering oscillator drives adjacent oscillating plates 1A to 1F in opposite phases. Accordingly, in the conventional meandering oscillator, piezoelectric actuators 2 are respectively arranged on oscillating plates 1A to 1F, and independent upper electrodes are arranged. Therefore, at least both of driving upper electrode and a wire for adjacent piezoelectric actuator 2 are arranged on oscillating plates 1A to 1F. Therefore, the space for upper electrode and wire is limited, and it is difficult ensure electrical insulating property between the upper electrode and the wire, which leads to a problem of reduction of the production efficiency. Further, this problem becomes more significant as the meandering oscillator becomes smaller.

In contrast, in the present embodiment, piezoelectric actuators 8 are alternately arranged on the plurality of oscillating plates 7A to 7E, as shown in FIG. 1. Therefore, adjacent oscillating plates 7A to 7E can be driven in opposite phases with only one upper electrode 11, and the number of electrodes arranged on the element can be reduced. In other words, in the present embodiment, upper electrode 11 and wire 12 thereof are alternately arranged oscillating plates 7A to 7E, so that oscillating plates 7A to 7E can be driven.

Therefore, the optical reflecting element can be made smaller, and even when meandering oscillator 4 is made smaller, the electrodes can be easily arranged. As a result, the productivity can be improved.

Further, in the present embodiment, mirror portion 3 is supported by supporting member 5 via two meandering oscillators 4, which constitutes both-sides support structure. Therefore, unnecessary vibration can be suppressed.

Still further, in the present embodiment, one end of meandering oscillator 4 is coupled with one end of mirror portion 3. Accordingly, the amplitude of mirror portion 3 can be increased due to the action of leverage.

In addition, as shown in FIG. 1, the other end of meandering oscillator 4 is coupled with supporting member 5 via a point on rotational axis 6 thereof, which results in the effect of suppressing unnecessary vibration. In other words, rotational axis 6 is the center of rotation of meandering oscillators 4, and there is hardly any displacement. Accordingly, when meandering oscillators 4 are supported in this region, meandering oscillators 4 can be stably supported.

In the above embodiment, both of the pair of meandering oscillators 4 are arranged with piezoelectric actuators 8 described above. However, in a case where meandering oscillators 4 are driven by resonation, piezoelectric actuator 8 may be arranged on only one of pair of meandering oscillators 4.

In this case, vibration is transmitted via mirror portion 3 from one meandering oscillator 4 having piezoelectric actuator 8 arranged thereon, so that other meandering oscillator 4 can also be driven by resonation.

Further, in this case, instead of upper electrode 11 of piezoelectric actuator 8, a monitor electrode (not shown) may be arranged on other meandering oscillator 4. This monitor electrode may be formed to have a wide width in the same manner as upper electrode 11. On the oscillating plate adjacent to the oscillating plate on which the monitor electrode is arranged, a narrow wire may be formed and drawn.

This monitor electrode can detect an electric signal based on a displacement of piezoelectric body 10 of meandering oscillator 4 on which the monitor electrode is formed. This electric signal can be inputted to upper electrode 11 of other meandering oscillator 4 via a feedback circuit.

Therefore, even when the resonant frequency of meandering oscillator 4 changes due to design errors or external environmental factors, a desired electric signal can be applied while checking the driving. As a result, the optical reflecting element can be driven by self-oscillation with high precision.

Embodiment 2

Figure 4A:
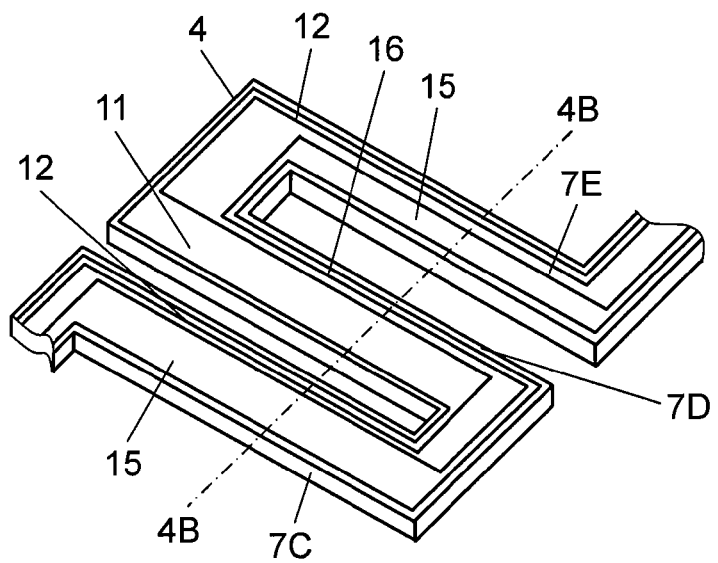
FIG. 4A is an enlarged perspective view illustrating an essential portion of an optical reflecting element according to Embodiment 2.

The present embodiment is different from Embodiment 1 in that, as shown in FIG. 4A, upper electrodes 11 and monitor electrodes 15 are alternately arranged on meandering oscillator 4.

Figure 4B:
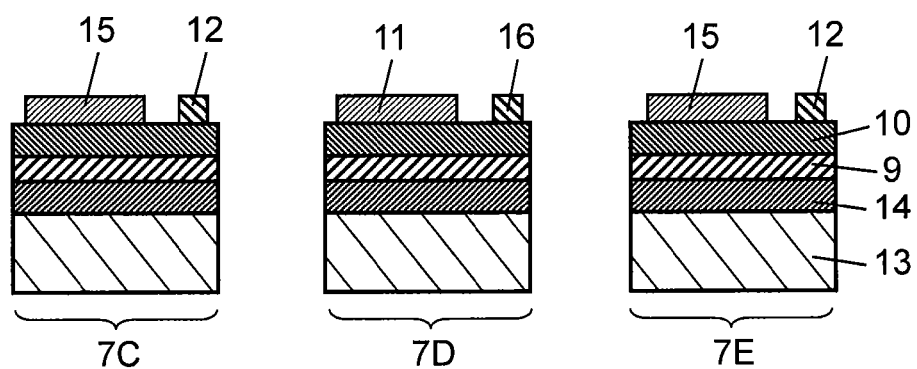
FIG. 4B is a cross sectional view taken along line 4B-4B of FIG. 4A.

In the present embodiment, as shown in FIG. 4B, monitor electrode 15 as well as upper electrode 11 is stacked on piezoelectric body 10. Further, on oscillating plates 7C, 7E, monitor electrode 15 is formed to have a wide width, and on adjacent oscillating plate 7D, wire 16 thereof is formed to have a narrow width.

In other words, in the present embodiment, oscillating plate 7D having wide upper electrode 11 arranged thereon is formed with wire 16 of monitor electrode 15, and oscillating plates 7C, 7E having wire 12 of upper electrode 11 arranged thereon are formed with wide monitor electrode 15. Monitor electrode 15 can detect an electric signal based on a displacement of piezoelectric body 10. Further, upper electrode 11 and monitor electrode 15 are alternately arranged on the plurality of oscillating plates 7C to 7E, so that the electric signal detected by monitor electrode 15 has a phase opposite to the electric signal applied to upper electrode 11. Therefore, when this signal is inputted to upper electrode 11 via a feedback circuit, meandering oscillator 4 can be driven by self-oscillation with high precision.

In contrast, when the monitor electrodes are to be arranged on meandering oscillators in a conventional optical reflecting element, the plurality of oscillating plates need to be arranged with at least one upper electrode, one wire, and one monitor electrode, totally three electrodes. Therefore, the space for the upper electrode, the monitor electrode, and each wire is limited, and it is difficult ensure electrical insulating property therebetween, which make it difficult to produce such element.

In contrast, in the present embodiment, piezoelectric actuators 8 are alternately arranged, and the number of electrodes arranged on one meandering oscillator 4 is two, which includes monitor electrode 15 and upper electrode 11, in the same manner as Embodiment 1 shown in FIG. 1. Accordingly, it is possible to suppress the increase in the number of electrodes, and the productivity of the small optical reflecting element can be improved.

The description about the same structures and effects as those of Embodiment 1 other than the above is omitted.

Embodiment 3

The present embodiment is mainly different from Embodiment 1 in that an optical reflecting element is driven about two axes by first and second meandering oscillators.

Figure 5:
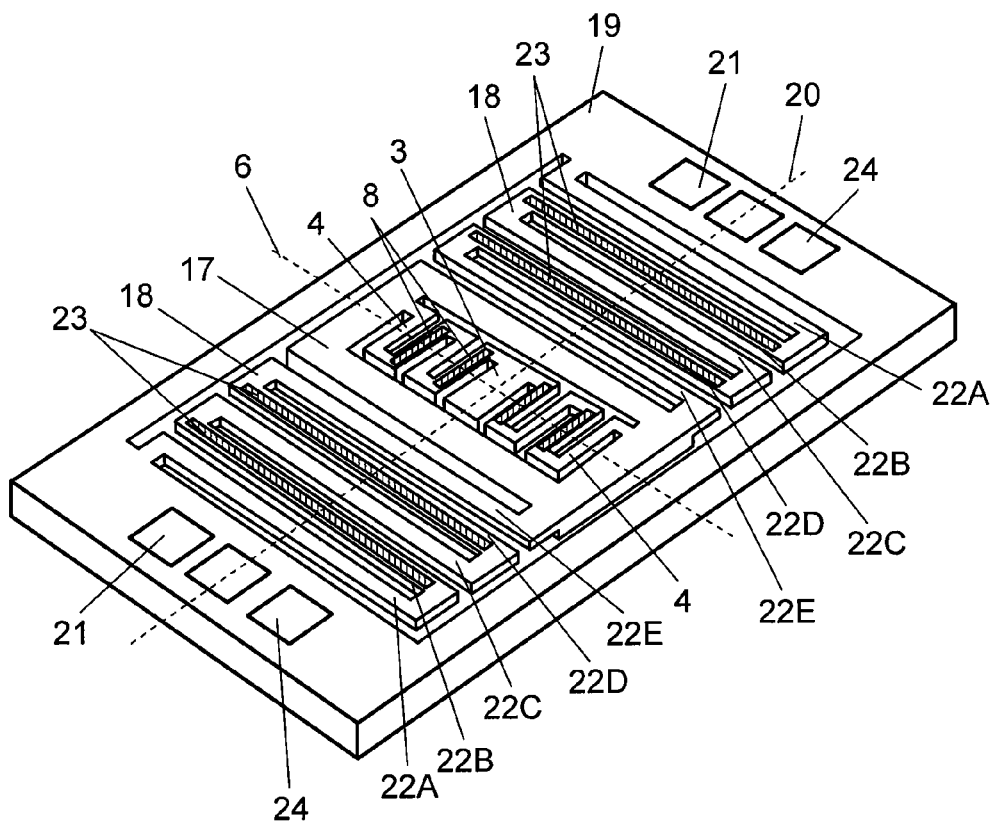
FIG. 5 is a perspective view illustrating an optical reflecting element according to Embodiment 3 of the present invention.

That is, as shown in FIG. 5, the optical reflecting element according to the present embodiment includes mirror portion 3, meandering oscillators 4 (first meandering oscillator), frame member 17, meandering oscillators 18 (second meandering oscillator), and supporting member 19.

More specifically, the optical reflecting element includes pair of meandering oscillators 4 (first meandering oscillators) which face each other with mirror portion 3 interposed therebetween and ends of which are respectively coupled with mirror portion 3, and also includes frame member 17 coupled with the other ends of meandering oscillators 4 and encircling the external peripheries of meandering oscillators 4 and mirror portions 3. The optical reflecting element further includes pair of meandering oscillators 18 (second meandering oscillators) which face each other with frame member 17 interposed therebetween and ends of which are respectively coupled with frame member 17, and also includes frame-shaped supporting member 19 coupled with respective other ends of meandering oscillators 18 and encircling external peripheries of meandering oscillators 18 and frame member 17. In the present embodiment, meandering oscillator 4 has the same structure as meandering oscillator 4 according to Embodiment 1, and the structure and the arrangement of piezoelectric actuator 8 are also the same as those of Embodiment 1.

Further, in the present embodiment, rotational axis 6 of meandering oscillator 4 and rotational axis 20 of meandering oscillator 18 are perpendicular to each other, so that scanning operation in the horizontal direction and the vertical direction can be performed by the light reflected by mirror portion 3.

Further, in the present embodiment, rotational axis 6 of meandering oscillator 4 and rotational axis 20 of meandering oscillator 18 intersect each other in the center of mirror portion 3. Therefore, the center of mirror portion 3 is a fixed point. When light enters into this fixed portion, the light path length of the incident light and the light path length of the reflected light become constant, so that an image can be projected with high precision.

Further, in the present embodiment, the wire of the upper electrode of meandering oscillator 4 (numeral 12 of FIG. 2A) is arranged on frame member 17 and meandering oscillators 18 and is drawn to connection terminal 21 of supporting member 19.

Further, meandering oscillator 18 includes piezoelectric actuators 23 arranged alternately on the plurality of oscillating plates 22A to 22E constituting meandering oscillator 18 in the same manner as meandering oscillator 4. In addition, the upper electrode of meandering oscillator 18 is drawn to connection terminal 24 on supporting member 19.

In the present embodiment, the number of electrodes of meandering oscillators 4, 18 can be reduced respectively. Therefore, even when the element is made smaller, the electrodes can be easily arranged. As a result, the productivity of optical reflecting element can be improved.

Especially in the case of two axes driving as in the present embodiment, the wire of the upper electrode of piezoelectric actuator 8 of inner meandering oscillator 4 may be arranged on meandering oscillator 18. In such case, as the optical reflecting element is made smaller, the space is insufficient, and it is difficult to ensure electrical insulating property between the upper electrode and the wire. Therefore, when each of meandering oscillator 4 and meandering oscillator 18 can be driven by only one upper electrode as in the present embodiment, a smaller number of electrodes are arranged, which contributes to the improvement in the productivity.

Further, piezoelectric actuators 8, 23 are respectively, alternately arranged on the plurality of oscillating plates (numerals 7A to 7E of FIG. 1) 22A to 22E, and any one of them can drive an adjacent oscillating plate in an opposite phase. Therefore, a large displacement can be obtained.

In the present embodiment, one of pair of meandering oscillators 4 and one of pair of meandering oscillators 18 may be arranged with monitor electrodes instead of the upper electrodes of piezoelectric actuators 8, 23. This is because when meandering oscillators 4, 18 having piezoelectric actuators 8, 23 arranged thereon are driven by resonation, the vibrating energy is transmitted, and meandering oscillators 4, 18 having the monitor electrodes arranged thereon can also be driven by resonation.

The description about the same structures and effects as those of Embodiment 1 other than the above is omitted.

Embodiment 4

The present embodiment is mainly different from Embodiment 1 in that an optical reflecting element is driven about two axes.

Figure 6:
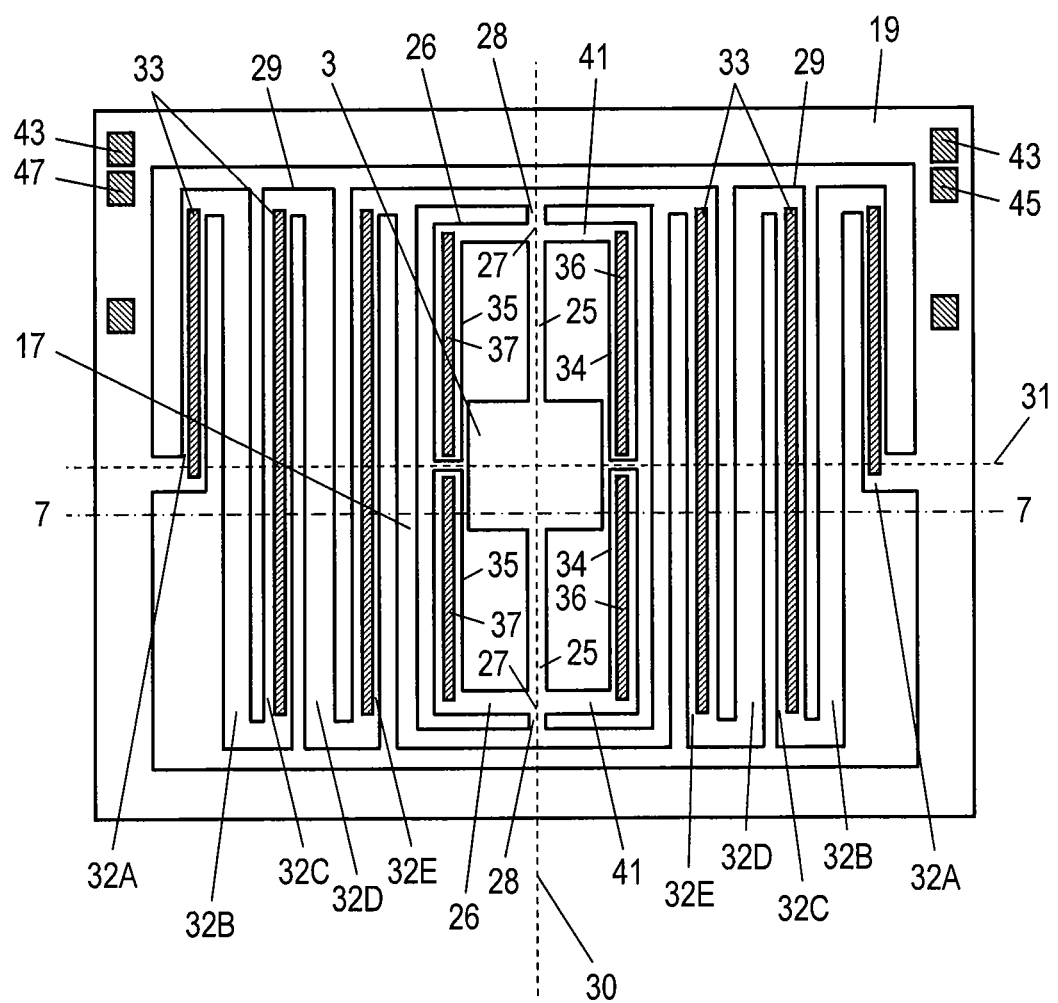
FIG. 6 is a top view illustrating an optical reflecting element according to Embodiment 4 of the present invention.

As shown in FIG. 6, an optical reflecting element according to the present embodiment includes mirror portion 3, pair of tuning fork-shaped piezoelectric oscillators 26 which face each other with mirror portion 3 interposed therebetween and which are respectively coupled with mirror portion 3 via first supporting portions 25, frame member 17 which is coupled with vibration centers 27 of tuning fork-shaped piezoelectric oscillators 26 via second supporting portions 28 and which encircles the external peripheries of pair of tuning fork-shaped piezoelectric oscillators 26, pair of meandering oscillators 29 which face each other with frame member 17 interposed therebetween and ends of which are respectively coupled with frame member 17, and frame-shaped supporting member 19 which are respectively coupled with the other ends of meandering oscillators 29 and which encircles the entire periphery of meandering oscillators 29 and frame member 17.

Opposing meandering oscillators 29 are arranged symmetrically with respect to rotational axis 30 of tuning fork-shaped piezoelectric oscillators 26, and ends thereof are connected to corners of frame member 17. The other ends thereof are connected to supporting member 19 via points on rotational axis 31 of meandering oscillators 29. Further, each of meandering oscillators 29 includes a plurality of oscillating plates 32A to 32E arranged in parallel with rotational axis 30 of tuning fork-shaped piezoelectric oscillators 26, and meandering oscillators 29 repeatedly meander. Piezoelectric actuators 33 are alternately arranged on oscillating plates 32A to 32E. In other words, piezoelectric actuators 33 are arranged on oscillating plates 32A, 32C, 32E. The composition of piezoelectric actuator 33 is basically the same as piezoelectric actuator 8 of meandering oscillator 4 according to Embodiment 1.

Each of tuning fork-shaped piezoelectric oscillators 26 has first arm 34 and second arm 35, which are arranged on both sides of first supporting portion 25. First arm 34 and second arm 35 are substantially parallel with rotational axis 30. Piezoelectric actuators 36, 37 are arranged on first arm 34, second arm 35, respectively.

Figure 7:
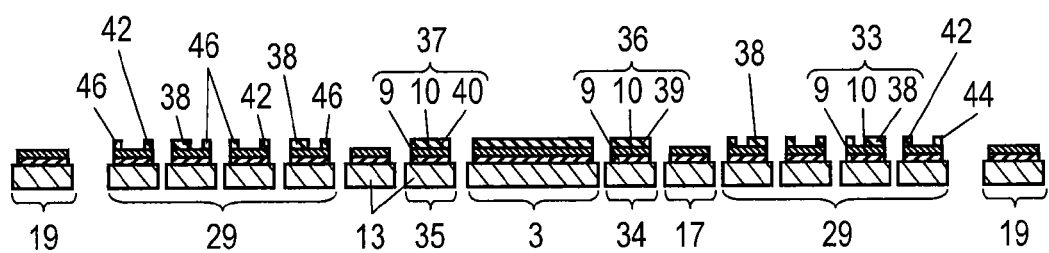
FIG. 7 is a cross sectional view taken along line 7-7 of FIG. 6.

FIG. 7 illustrates a cross sectional diagram taken along line 7-7 of FIG. 6. As shown in FIG. 7, piezoelectric actuators 33, 36, 37 include lower electrode 9, piezoelectric body 10, and upper electrodes 38, 39, 40. In the present embodiment, lower electrode 9 and piezoelectric body 10 are commonly arranged on tuning fork-shaped piezoelectric oscillators 26 and meandering oscillators 29. Upper electrodes 38, 39, 40 are formed to be electrically independent from each other.

As shown in FIG. 6, in the present embodiment, rotational axis 30 of tuning fork-shaped piezoelectric oscillator 26 and rotational axis 31 of meandering oscillator 29 are perpendicular to each other. This vibration drives mirror portion 3 in a vertical direction and a horizontal direction.

In the present embodiment, first supporting portion 25 and second supporting portion 28 are arranged on rotational axis 30 of tuning fork-shaped piezoelectric oscillators 26.

Further, in the present embodiment, vibration design is made so that the resonant frequency of tuning fork-shaped piezoelectric oscillator 26 is substantially the same as the resonant frequency of the twisting oscillator including mirror portion 3 and first supporting portion 25. With this, when tuning fork-shaped piezoelectric oscillator 26 is driven by resonance, the twisting oscillator can also be caused to resonate, which can efficiently, repeatedly rotate and vibrate mirror portion 3.

Further, in the present embodiment, the signal having the resonant frequency of meandering oscillator 29 is also applied to meandering oscillator 29, and meandering oscillator 29 is driven by resonance. Accordingly, the amplitudes of the plurality of oscillating plates 32A to 32E are accumulated, and frame member 17 can be efficiently, repeatedly caused to rotate and vibrate. Further, since the oscillator has meandering shape, the resonator length can be made larger, and the resonator can be driven at a low frequency.

Further, first arms 34, second arms 35, connection portions 41, and meandering oscillators 29 are made to have the same width, so that unnecessary vibration mode occurring in the optical reflecting element can be reduced.

Further, since tuning fork-shaped piezoelectric oscillator 26 has a U-shape, unnecessary vibration mode can be suppressed.

In the present embodiment, upper electrodes 38 of piezoelectric actuators 33 formed on oscillating plates 32A, 32C, 32E of the third meandering oscillator as shown in FIG. 7 are connected to connection terminals 43 of FIG. 6 via wires 42. On the other hand, upper electrodes 39 of piezoelectric actuators 36 formed on first arms 34 as shown in FIG. 7 are connected to connection terminals 45 of FIG. 6 via wires 44. Further, upper electrodes 40 of piezoelectric actuators 37 formed on second arms 35 as shown in FIG. 7 are connected to connection terminals 47 via wires 46. Accordingly, electric signals can be applied to piezoelectric actuators 33, 36, 37, such that electric signals of opposite polarities are applied to first arm 34 and second arm 35, and an electric signal having the resonant frequency thereof is applied to meandering oscillator 29.

Subsequently, the principle of operation of the optical reflecting element having the above structure will be described.

When an alternating current driving voltage is applied to lower electrode 9 and upper electrodes 39, 40 as shown in FIG. 7, the layer of piezoelectric body 10 expands or contracts in the surface direction, and first arm 34 and second arm 35 perform flexural oscillation in the vertical direction with respect to base material 13.

Figure 8:
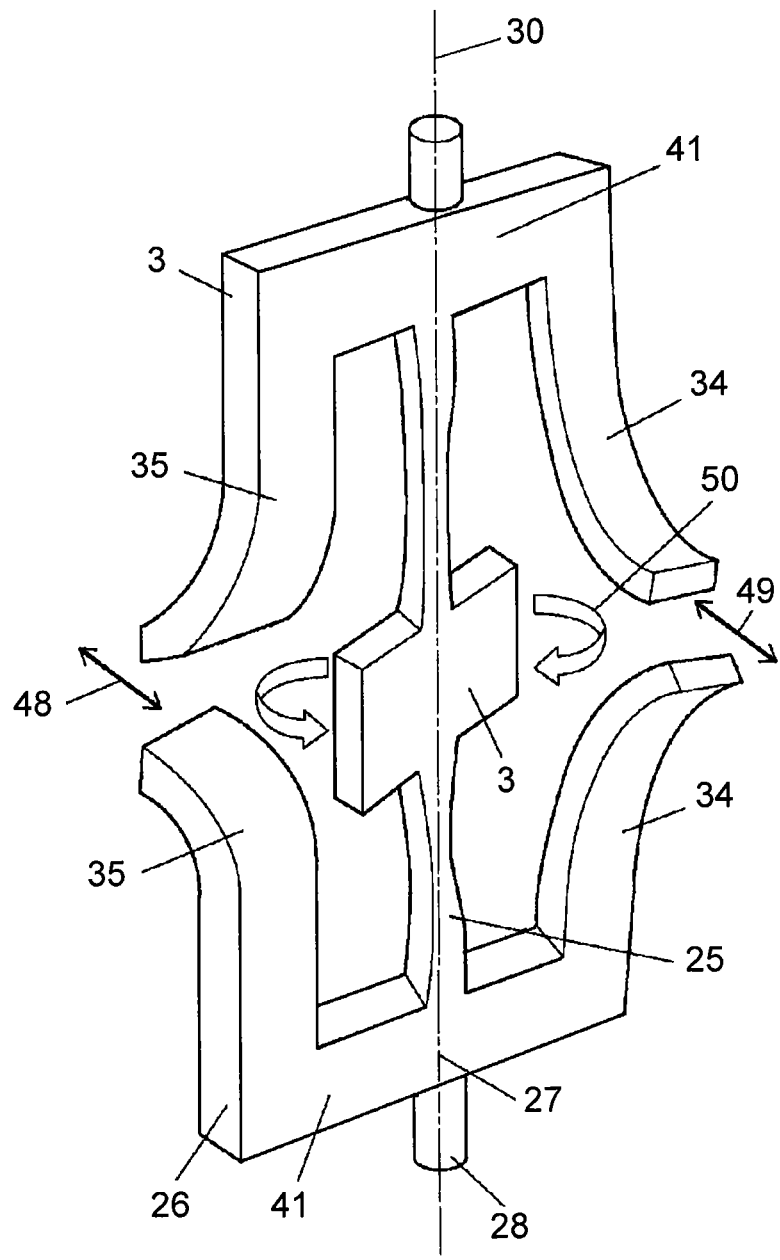
FIG. 8 is a schematic diagram illustrating operational states of the optical reflecting element according to Embodiment 4 of the present invention.

At this occasion, as shown in FIG. 8, where driving signals having opposite polarities are applied to piezoelectric actuators 36, 37 respectively formed on first arm 34 and second arm 35, first arm 34 and second arm 35 can perform flexural oscillation in directions whose phases are 180 degrees different (directions of arrows 48, 49), i.e., opposite directions. Herein, in the present embodiment, first and second arms 34, 35 have a single-side support structure in which the leading ends of first and second arms 34, 35 are free. Accordingly, first and second arms 34, 35 can perform flexural oscillation greatly.

Further, vibrational energy of first arm 34 and second arm 35 is transmitted to connection portions 41 of tuning fork-shaped piezoelectric oscillator 26. Accordingly, tuning fork-shaped piezoelectric oscillators 26 perform repeated rotational vibration (twisting vibration) at a predetermined frequency about rotational axis 30, i.e., a line passing through vibration center 27 of tuning fork-shaped piezoelectric oscillators 26.

Subsequently, the vibrational energy of this repeated rotational vibration is transmitted to first supporting portions 25 coupled with connection portions 41, and the twisting oscillator including first supporting portions 25 and mirror portion 3 performs twisting vibration in the direction of arrow 50 about rotational axis 30 thereof. Accordingly, mirror portion 3 performs repeated rotational vibration about rotational axis 30 thereof. At this occasion, the repeated rotational vibration of tuning fork-shaped piezoelectric oscillators 26 and the repeated rotational vibration of the twisting oscillator including first supporting portion 25 and mirror portion 3 are in directions whose phases are 180 degrees opposite from each other.

When a voltage is applied to lower electrode 9 and upper electrode 38 as shown in FIG. 7, adjacent oscillating plates 32A to 32E are displaced and driven in the opposite phases in meandering oscillators 29 as shown in FIG. 6, so that entire meandering oscillator 29 accumulates displacement about the rotational axis thereof (numeral 31 of FIG. 6), and a large displacement can be obtained. Further, when an alternating current voltage is applied, the polarity of this displacement changes in every unit time, which causes repeated rotational vibration.

Then, the vibrational energy produced by meandering oscillators 29 causes ends of frame member 17 to vibrate in the vertical direction, and frame member 17 is caused to perform repeated rotational vibration about rotational axis 31 of meandering oscillator 29.

When frame member 17 vibrates in this manner, mirror portion 3 supported by frame member 17 can also perform repeated rotational vibration about rotational axis 31 of meandering oscillator 29.

Then, for example, a light beam generated by a laser light source or an LED light source is inputted to mirror portion 3, and vibrating mirror portion 3 reflects the light beam, so that scanning can be performed on a screen with the light beam. Further, in the present embodiment, rotational axes 30 and 31 of tuning fork-shaped piezoelectric oscillators 26 and meandering oscillators 29 are perpendicular to each other. Accordingly, scanning can be performed in the vertical and horizontal directions with light reflected by mirror portion 3.

In the present embodiment, the productivity of the optical reflecting element can be improved in the same manner as Embodiment 1.

Further, in the present embodiment, a combination of tuning fork-shaped piezoelectric oscillators 26 and meandering oscillators 29 increases the frequency ratio of the vibration in the optical reflecting element driven about two axes.

This is because the repeated rotational vibration about one rotational axis 30 can be driven at a high frequency by tuning fork-shaped piezoelectric oscillators 26, and the repeated rotational vibration about other rotational axis 31 can be driven at a low frequency by the meandering beams of meandering oscillators 29 having a long beam length.

As a result, the frequency ratio can be increased in the optical reflecting element driven about two axes.

Especially when an image is projected, a scanning speed in a horizontal direction of a screen is preferably larger than a scanning speed in a vertical direction in order to increase the resolution of the image.

In the present embodiment, meandering oscillators 29 are employed as oscillators in order to perform scanning in the vertical direction with the light. Therefore, a long beam length can be easily designed even in a small element, and the frequency ratio of the optical reflecting element driven about two axes can be increased.

Further, in the present embodiment, a smaller oscillator arranged on the inner side has a tuning fork shape. Therefore, the pattern is simple, and the production efficiency can be improved.

Further, tuning fork-shaped piezoelectric oscillator 26 has a tuning fork shape. Therefore, the end of the arm is free, and the vibrating angle of mirror portion 3 can be efficiently increased even when the size is small. It should be noted that when tuning fork-shaped piezoelectric oscillator 26 is driven at a high frequency, the amplitude is small. Accordingly, when the amplitude can be thus obtained efficiently, a highly-precise optical reflecting element can be achieved.

Further, the vibration source is a tuning fork shape having a high Q value, and accordingly, a large vibrational energy can be obtained from a small energy, which contributes to reducing the size of the element.

Further, vibration design is made for tuning fork-shaped piezoelectric oscillators 26 and meandering oscillators 29. Accordingly, the reflecting angle of the output light can be greatly changed, and an optical reflecting element capable of sweeping an input light such as laser light beam so as to become a predetermined design value can be achieved.

Further, the present embodiment has the following structure. Both sides of mirror portion 3 are encircled by pair of tuning fork-shaped piezoelectric oscillators 26. The external peripheries of tuning fork-shaped piezoelectric oscillators 26 are encircled by frame member 17. Both sides of frame member 17 are encircled by pair of meandering oscillators 29. The external peripheries of meandering oscillators 29 are encircled by supporting member 19. Therefore, the size of the area of the element can be effectively made use of, and the element can be made smaller.

In the present embodiment, first and second arms 34, 35 respectively have linear shape. Therefore, it is easy to process first and second arms 34, 35.

In the present embodiment, tuning fork-shaped piezoelectric oscillators 26 are arranged in a symmetrical manner on both sides of mirror portion 3. Accordingly, mirror portion 3 can be stably driven in a symmetrical manner, and the center of mirror portion 3 is the fixed point, which achieves stable scanning with light.

Further, both ends of mirror portion 3 are supported by first supporting portions 25, which constitutes both-sides support structure. Therefore, unnecessary resonation of mirror portion 3 can be suppressed, and the affect exerted by external vibration can be reduced.

Still further, in the present embodiment, meandering oscillators 29 are symmetrically arranged on both sides of frame member 17. Accordingly, the center of frame member 17 can be driven as the fixed point.

Further, both ends of frame member 17 are supported by meandering oscillators 29, which constitutes both-sides support structure. Therefore, unnecessary resonation of frame member 17 can be suppressed, and the affect exerted by external vibration can be reduced.

In the above embodiment, piezoelectric actuators 36, 37 are formed on both of first arms 34 and second arms 35. Alternatively, piezoelectric actuators 36, 37 may be formed on at least only one of first arms 34 and second arms 35. This makes use of characteristics of tuning fork-shaped piezoelectric oscillator 26. When one of the arms vibrates, movement energy is transmitted via connection portion 41 to the other arm, and the other arm can also be driven in the opposite phase. This eliminates the necessity of one of upper electrodes 39 and 40 as shown in FIG. 7, and reduces the number of electrodes. Therefore, the productivity of the optical reflecting element can be improved.

In the present embodiment, piezoelectric actuators 33, 36, 37 are formed on one side of each of tuning fork-shaped piezoelectric oscillators 26 and meandering oscillators 29. Alternatively, piezoelectric actuators 33, 36, 37 may be formed on both sides thereof. Since tuning fork-shaped piezoelectric oscillator 26 has a smaller area and a weaker driving force than meandering oscillator 29, piezoelectric actuators may be formed on both sides of base material 13 of only tuning fork-shaped piezoelectric oscillator 26.

When each of first supporting portion 25 and second supporting portion 28 is made to have a circular cross section, vibration mode of twisting vibration is stabilized, and unnecessary resonance can be suppressed. Therefore, an optical reflecting element that is less likely to be affected by external vibration can be achieved.

Further, monitor electrodes (not shown) may be respectively arranged on oscillating plates 32A to 32E of meandering oscillators 29 and on first arms 34 and second arms 35 of tuning fork-shaped piezoelectric oscillators 26.

The description about the same structures and effects as those of Embodiment 1 other than the above is omitted.

Figure 10:
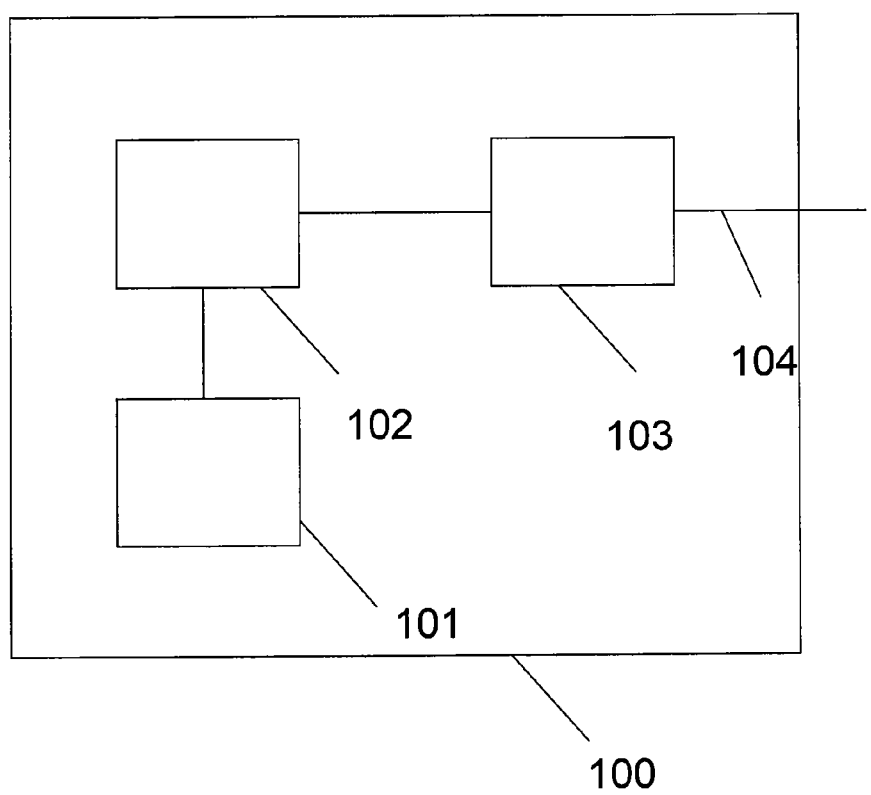
FIG. 10 is a block diagram illustrating an image projection device using the optical reflecting element according to the present invention.

FIG. 10 shows a block diagram of an image projection device 100 using the meandering oscillator as an optical reflecting element. In image projection device 100, driving circuit 101 drives optical reflecting element 102 made of the meandering oscillator. Optical reflecting element 102 precisely controls scanning operation in one axis or two axes directions with a light beam 104 emitted from a light source 103. Therefore, this is effective for image projection devices such as a head up display (HDU), a head mount display (HMD), and a micro projector.

The present invention has an effect of reducing the size of the optical reflecting element, and is useful for an electrophotographic copier, a laser printer, a laser exposure device, an optical scanner, and the like which has a light source.

INDUSTRIAL APPLICABILITY

The present invention has an effect of reducing the size of the optical reflecting element, and particularly is useful for an electrophotographic copier, a laser printer, a laser exposure device, an image projection device, an optical scanner, and the like, having a light source.

REFERENCE MARKS IN THE DRAWINGS

3 Mirror portion
4 Meandering oscillator
5 Supporting member
6 Rotational axis
7A, 7B, 7C, 7D, 7E Oscillating plate
8 Piezoelectric actuator
9 Lower electrode 10 Piezoelectric body
11 Upper electrode
12 Wire
13 Base material
14 Insulating film
15 Monitor electrode
16 Wire
17 Frame member
18 Meandering oscillator
19 Supporting member
20 Rotational axis
21 Connection terminal
22A, 22B, 22C, 22D, 22E Oscillating plate
23 Piezoelectric actuator
24 Connection terminal
25 First supporting portion
26 Tuning fork-shaped piezoelectric oscillator
27 Vibration center
28 Second supporting portion
29 Meandering oscillator
30 Rotational axis
31 Rotational axis
32A, 32B, 32C, 32D, 32E Oscillating plate
33 Piezoelectric actuator
34 First arm
35 Second arm
36 Piezoelectric actuator
37 Piezoelectric actuator
38 Upper electrode
39 Upper electrode
40 Upper electrode
41 Connection portion
42 Wire
43 Connection terminal
44 Wire
45 Connection terminal
46 Wire
47 Connection terminal
48, 49 Arrow
50 Arrow

The invention claimed is:

1. A meandering oscillator, comprising:
    a plurality of oscillating plates bent and coupled in predetermined directions; and
    piezoelectric actuators arranged on alternate oscillating plates without being arranged on others of the oscillating plates, wherein
    each of the piezoelectric actuators includes a lower electrode, a piezoelectric body, and an upper electrode stacked on the corresponding oscillating plates in this order, and
    the plurality of oscillating plates are parallel to each other relative to a rotational axis of the meandering oscillator and extend perpendicular to the rotational axis.

2. The meandering oscillator according to claim 1, wherein a wire of the upper electrode is arranged on an oscillating plate adjacent to an oscillating plate having the piezoelectric actuator arranged thereon.

3. The meandering oscillator according to claim 1, wherein a monitor electrode is arranged on an oscillating plate adjacent to an oscillating plate having the piezoelectric actuator arranged thereon.

4. The meandering oscillator according to claim 3, wherein the monitor electrode and a wire of the upper electrode are arranged on an oscillating plate adjacent to an oscillating plate having the piezoelectric actuator arranged thereon.

5. An optical reflecting element including a mirror portion coupled with an end of a meandering oscillator according to claim 1.

6. An optical reflecting element, comprising:
    a first meandering oscillator according to claim 1, one end of which is coupled with a mirror portion;
    a frame member which is coupled with the other end of the first meandering oscillator and which encircles external peripheries of the first meandering oscillator and the mirror portion;
    a second meandering oscillator according to claim 1, one end of which is coupled with the frame member; and
    a supporting member coupled with the other end of the second meandering oscillator.

7. The optical reflecting element according to claim 6, wherein
    a wire of the upper electrode is arranged on an oscillating plate adjacent to an oscillating plate having the piezoelectric actuator arranged thereon.

8. The optical reflecting element according to claim 6, wherein
    a monitor electrode is arranged on an oscillating plate adjacent to an oscillating plate having the piezoelectric actuator arranged thereon.

9. An optical reflecting element, comprising:
    a mirror portion;
    a tuning fork-shaped piezoelectric oscillator coupled with the mirror portion via a first supporting portion;
    a frame member which is coupled with a vibration center of the tuning fork-shaped piezoelectric oscillator via a second supporting portion and which encircles external peripheries of the tuning fork-shaped piezoelectric oscillator and the mirror portion;
    a meandering oscillator according to claim 1, one end of which is coupled with the frame member; and
    a supporting member coupled with the other end of the meandering oscillator.

10. An image projection device comprising:
    a meandering oscillator according to claim 1;
    a driving circuit for driving the meandering oscillator; and
    a light source controlled by the meandering oscillator.

11. The meandering oscillator according to claim 1, wherein the piezoelectric actuators are applied an alternating current voltage for resonation which increases an amount of displacement of the plurality of oscillating plates.

12. A meandering oscillator comprising:
    a first oscillating plate;
    a second oscillating plate coupled with the first oscillating plate; and
    a piezoelectric actuator being arranged on the first oscillating plate and the piezoelectric actuator not being arranged on the second oscillating plate,
    wherein the piezoelectric actuator includes a lower electrode, a piezoelectric body, and an upper electrode stacked on the first oscillating plate in this order, and
    wherein the first oscillating plate and the second oscillating plate are parallel to each other relative to a rotational axis of the meandering oscillator and extend perpendicular to the rotational axis.

13. The meandering oscillator according to claim 12, wherein the piezoelectric actuator is applied an alternating current voltage for resonation which increases an amount of displacement of the first oscillating plate.

* * * * *